United States Patent
El-Shall et al.

(10) Patent No.: US 7,413,725 B2
(45) Date of Patent: Aug. 19, 2008

(54) COPPER AND/OR ZINC ALLOY NANOPOWDERS MADE BY LASER VAPORIZATION AND CONDENSATION

(75) Inventors: M. Samy El-Shall, Richmond, VA (US); Sarojini Deevi, Midlothian, VA (US); Yezdi B. Pithawalla, Richmond, VA (US); Seetharama C. Deevi, Midlothian, VA (US); A. Clifton Lilly, Jr., Chesterfield, VA (US)

(73) Assignee: Philip Morris USA Inc., Richmond, VA (US)

( * ) Notice: Subject to any disclaimer, the term of this patent is extended or adjusted under 35 U.S.C. 154(b) by 0 days.

(21) Appl. No.: 10/915,693

(22) Filed: Aug. 11, 2004

(65) Prior Publication Data

US 2005/0061108 A1    Mar. 24, 2005

Related U.S. Application Data

(63) Continuation of application No. 10/066,365, filed on Feb. 5, 2002, now abandoned.

(51) Int. Cl.
- *C01G 9/02* (2006.01)
- *C01G 11/02* (2006.01)
- *C01G 13/02* (2006.01)
- *B01J 23/00* (2006.01)
- *B01J 23/70* (2006.01)

(52) U.S. Cl. ............... 423/594.14; 502/343; 502/345

(58) Field of Classification Search ............... 502/343, 502/345; 420/477, 521; 423/23, 99, 604, 423/622, 623, 594.14; 204/157.41
See application file for complete search history.

(56) References Cited

U.S. PATENT DOCUMENTS

| | | | |
|---|---|---|---|
| 3,476,547 A * | 11/1969 | Martyniuk | 75/352 |
| 4,067,752 A | 1/1978 | Brook et al. | |
| 4,131,453 A | 12/1978 | Kim et al. | |
| 4,349,464 A | 9/1982 | Wainwright et al. | |
| 4,363,752 A | 12/1982 | Goretta et al. | |
| 4,504,597 A | 3/1985 | Klar et al. | |
| 4,533,383 A | 8/1985 | Miura et al. | |
| 4,675,306 A | 6/1987 | Mazanec et al. | |

(Continued)

OTHER PUBLICATIONS

Notification of Transmittal of International Preliminary Examination Report dated Mar. 24, 2005 for PCT/US03/03417.

(Continued)

*Primary Examiner*—Cam N. Nguyen
(74) *Attorney, Agent, or Firm*—Buchanan Ingersoll & Rooney PC (57) ABSTRACT

A method of making Cu, Zn, and/or Cu/Zn alloy nanoparticles subjects one or more targets to laser energy to form a vapor and condenses the vapor to form nanoparticles having an average particle size of less than 20 nm. The optional application of an electric field results in nanoparticles with aspect ratios greater than 1.0. The target(s) can be a single target or separate targets comprising a mixture of copper, zinc, and/or copper/zinc. When separate targets are used, the laser beam can be split to form two separate beams each of which is made incident upon one of the targets. The nanoparticles can be formed in a chamber having an inert atmosphere or a reactive atmosphere and a convection current is created in the chamber by maintaining the top plate at a lower temperature than the bottom plate.

38 Claims, 10 Drawing Sheets

U.S. PATENT DOCUMENTS

| | | | |
|---|---|---|---|
| 4,711,773 A | | 12/1987 | Mesters et al. |
| 5,128,081 A | | 7/1992 | Siegel et al. |
| 5,168,097 A | | 12/1992 | Araya et al. |
| 5,286,444 A | | 2/1994 | Tomikawa et al. |
| 5,300,203 A | | 4/1994 | Smalley |
| 5,306,328 A | | 4/1994 | Streckel et al. |
| 5,320,800 A | | 6/1994 | Siegel et al. |
| 5,374,391 A | * | 12/1994 | Kuwabara et al. ............. 419/19 |
| 5,498,446 A | | 3/1996 | Axelbaum et al. |
| 5,512,662 A | * | 4/1996 | Kalchauer et al. ........... 556/472 |
| 5,514,349 A | | 5/1996 | Parker et al. |
| 5,580,655 A | | 12/1996 | El-Shall et al. |
| 5,590,388 A | * | 12/1996 | Kuwabara et al. ............. 419/39 |
| 5,658,401 A | * | 8/1997 | Gaag et al. .................. 148/434 |
| 5,695,617 A | | 12/1997 | Graiver et al. |
| 5,728,195 A | | 3/1998 | Eastman et al. |
| 5,766,377 A | * | 6/1998 | Mueller et al. ............... 148/434 |
| 5,788,738 A | | 8/1998 | Pirzada et al. |
| 5,817,855 A | | 10/1998 | Langner et al. |
| 5,851,507 A | | 12/1998 | Pirzada et al. |
| 5,874,684 A | | 2/1999 | Parker et al. |
| 5,984,996 A | | 11/1999 | Gonsalves et al. |
| 5,984,997 A | | 11/1999 | Bickmore et al. |
| 6,033,624 A | | 3/2000 | Gonsalves et al. |
| 6,080,699 A | | 6/2000 | Pohl |
| 6,136,061 A | | 10/2000 | Gibson |
| 6,136,156 A | | 10/2000 | El-Shall et al. |
| 6,254,940 B1 | | 7/2001 | Pratsinis et al. |
| 6,391,163 B1 | * | 5/2002 | Pavate et al. ........... 204/192.15 |
| 6,632,300 B2 | | 10/2003 | Breedis et al. |
| 6,716,525 B1 | | 4/2004 | Yadav et al. |
| 6,881,703 B2 | * | 4/2005 | Cutler et al. ................ 502/439 |

OTHER PUBLICATIONS

Jackie Y. Ying and Andreas Tschope, Gas-Phase Synthesis of Nonstoichiometric Nanocrystalline Catalysts, Advanced Catalysts and Nanostructured Materials *Modern Synthetic Methods*, 1996, pp. 231-257, Academic Press, San Diego, California.

Qi Sun et al., A novel Process for the Preparation of Cu/ZnO and Cu/ZnO/Al$_2$O$_3$ Ultrafine Catalyst: Structure, Surface Properties, and activity for Methanol Synthesis from CO$_2$+H$_2$, Journal of Catalysis 167, 92-105 , 1997, pp. 92-105, Academic Press, San diego, California.

M.S. Spencer, The role of Zinc Oxide in Cu/ZnO Catalysts for Methanol Synthesis and the Water-gas Shift Reaction, Topics in Catalysis 8, 1999, pp. 259-266, J.C. Baltzer AG. Science Publishers.

Jan H. Schlander & Thomas Turek, Gas-Phase Hydrogenolysis of Dimethyl Maleate to 1,4-Butanediol and γ-Butyrolactone over copper/Zinc Oxide Catalyst, Ind.Eng. Chem. Res., vol. 38, No. 4, 1999, pp. 1264-1270, American Chemical Society.

L. Huang et al., Methanol Synthesis Over Cu/ZnO Catalysts Prepared by Ball Milling, Catalysis Letters 48, 1997, pp. 55-59, J.C. Baltzer AG, Science Publishers.

Joseph L. Katz, Condensation of a Supersaturated Vapor.I. The Homogeneous Nucleation of the η-Alkanes, The Journal of Chemical Physics, vol. 52, No. 9, May 1970, pp. 4733-4748, American Institute of Physics, Lancaster, PA.

Leon L. Shaw, Processing Nanostructured Materials: An Overview, JOM, Dec. 2000, pp. 41-45.

Dr. Bob F. Cochrane et al., Non-Ferrous Metallurgy and Intermetallics Research Group, Department of Materials, Materials Online, pp. 1-8.

TMS Annual Meeting, Chemistry and Physics of Nanostructures and Related Nonequilibrium Materials: Session VII: Electromagnetic Properties, 1997, p. 1-3.

Laser Vaporization Source, Ft-ICR Garching: Laser Vaporization Source (copy provided Jan. 11, 2001).

T. Guo et al., Catalytic Growth of Single-Walled Nanotubes by Laser Vaporization, Chemistry Physics Letter 243, 49, 1995, pp. 1-4.

L. Takacs, Nanostructured Materials (copy provided Jan. 11, 2001).

* cited by examiner

COPPER AND/OR ZINC ALLOY NANOPOWDERS MADE BY LASER VAPORIZATION AND CONDENSATION

FIELD OF THE INVENTION

This application is a continuation application of U.S. application Ser. No. 10/066,365 entitled COPPER AND/OR ZINC ALLOY NANOPOWDERS MADE BY LASER VAPORIZATION AND CONDENSATION, filed on Feb. 5, 2002 now abandoned, the entire content of which is hereby incorporated by reference.

BACKGROUND

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Nanoparticles of various metals, intermetallics, semiconductors, metal carbonates, and metal oxides are disclosed in various publications. See, for example, U.S. Pat. Nos. 5,580,655; 5,695,617; 5,770,022; 5,879,715; 5,891,548 and 5,962,132. Additionally, these materials are of interest for environmental and industrial processes. For example, methanol synthesis, water-gas shift reactions, and gas-phase hydrogenolysis have been the subject of catalysis research that has included studying the role of copper, zinc and/or aluminum. See, for example, Q. Sun et al., "A Novel Process for the Preparation of Cu/ZnO and Cu/ZnO/Al$_2$O$_3$ Ultrafine Catalyst: Structure, Surface Properties, and Activity for Methanol Synthesis from CO$_2$+H$_2$", *J. of Catalysis*, vol. 167, p. 92 (1997); M. S. Spencer, "The Role of Zinc Oxide in Cu/ZnO Catalysts for Methanol Synthesis and the Water-Gas Shift Reaction", *Topics in Catalysis*, vol. 8, p. 259 (1999); J. H. Schlander et al., "Gas-Phase Hydrogenolysis of Dimethyl Maleate to 1,4-Butanediol and γ-Butyrolactone over Copper/Zinc Oxide Catalysts", *Ind. Eng. Chem. Res.*, vol. 38, p. 1264 (1999); L. Huang et al., "Methanol Synthesis Over Cu/ZnO Catalysts Prepared by Ball Milling", *Catalysis Letters*, vol. 48, p. 55 (1997); and J. Y. Ying and A. Tschöpe, "Gas-Phase Synthesis of Nonstoichiometric Nanocrystalline Catalysts", in *Advanced Catalysts and Nanostructured Materials*, W. R. Moser, Ed., New York: Academic Press, p. 231 (1996).

Techniques for preparing nanostructured materials are also discussed in an article by L. L. Shaw, *JOM*, vol. 52, p. 41 (2000). Previously, nanoparticles have been produced by various methods including chemical synthesis, gas-phase synthesis, condensed phase synthesis, high speed deposition by ionized cluster beams, high speed milling, deposition and sol-gel methods. These methods suffer from numerous drawbacks, including agglomeration, broad particle size distribution, or low volume production.

The most common method reported in the literature for the synthesis of intermetallic nanoparticles is mechanical ball milling. See, for example, E. Jartych, et al., *J. Phys. Condens. Matter*, vol. 10, p. 4929 (1998); Jartych E., et al., *Nanostructured Materials*, vol. 12, p. 927 (1999); X. Amilis, et al., *Nanostructured Materials* vol. 12, p. 801 (1999); and R. J. Perez, et al., *Nanostructured Materials*, vol. 7, p. 565 (1996). In spite of the simplicity and efficiency of ball milling, there are certain problems and limitations. For example, the microstructure of the milling products is very sensitive to the grinding conditions and may be unpredictably affected by unwanted contamination from the milling media and from the atmosphere. In addition, excessively long periods of milling time may be required to obtain particles smaller than 20 nm.

Other methods of making nanostructured metals, metal carbides and metal alloys are disclosed in U.S. Pat. Nos. 5,984,996 and 6,033,624. 5,984,997 discloses a process for making nanoscale powders comprising mixing an emulsion including all of the elements of the desired powder composition and a combustible fuel and combusting the emulsion to produce the powder. U.S. Pat. No. 6,136,061 discloses nanostructured metal compacts formed from nanosize metal particles which exhibit a preferred grain orientation.

Nanoparticles have also been synthesized from vapor. U.S. Pat. No. 4,533,383, for example, discloses a method for making a powder of an alloy of two or more metals by vaporizing each of the metals in its own vaporization chamber, mixing the vapors with an inert carrier gas and condensing the mixed vapors into particles. U.S. Pat. No. 5,498,446 discloses a method and apparatus for reacting sodium vapor with gaseous chlorides in a flame to produce nanoscale particles. U.S. Pat. Nos. 5,514,349 and 5,874,684 disclose a method and system for synthesizing nanocrystalline material by vaporizing a consumable anode using an arc formed between the consumable anode and a cathode. U.S. Pat. No. 5,728,195 discloses a process for producing multi-component and multiphase nanophase materials comprising vaporizing a plurality of elements in a controlled atmosphere, mixing the vapors, and condensing. U.S. Pat. Nos. 5,788,738 and 5,851,507 disclose methods of producing nanoscale powders by quenching of vapors.

Techniques for forming nanoparticles involving laser vaporization are also known. See, for example, U.S. Pat. Nos. 5,128,081; 5,300,203; 5,320,800; 5,580,655; 5,695,617; and 6,136,156.

There still exists a need for improved methods of making nanoparticles of metal alloys, such as copper-zinc alloys, that allow for improved control of particle size and composition.

SUMMARY OF THE INVENTION

In a first embodiment of the invention, a method of making nanoparticles of copper and/or zinc alloys is provided. The method includes mounting one or more targets in a chamber, vaporizing material from each of the one or more targets by subjecting each of the one or more targets to a beam of laser energy to form a vapor, and condensing the vapor to form the nanoparticles. The one or more targets can be a single target comprising a Cu and/or Zn alloy, a Cu/Zn alloy wrapped in zinc, or a compact comprising copper and zinc powders or brass and zinc powders.

Alternatively, the one or more targets can include a first target comprising copper and a second target comprising zinc and the method can further include steps of: forming a beam of laser energy; splitting the beam of laser energy into first and second beams of laser energy; subjecting the first target to the first beam of laser energy to form a first vapor; subjecting the second target to the second beam of laser energy to form a second vapor; allowing the first and second vapors to mix; and condensing the mixed vapors to form the Cu and/or Zn alloy nanoparticles.

The pressure in the chamber is maintained above atmospheric pressure during vaporization and a temperature gradient is established between the bottom plate and top plate. Inert gas, reactive gas, or mixtures thereof are introduced into the reaction chamber and allows for controlled production of reactive materials such as oxides, nitrides and carbides and oxides, nitrides, and carbides of Cu, Zn, Cu—Zn, or other intermetallic alloys.

By controlling the laser power, the temperature gradient and the pressure in the reaction chamber, the size of the nanoparticles can be controlled. Cu and/or Zn alloy nanoparticles thus formed have an average particle size below 20 nm as measured using TEM.

BRIEF DESCRIPTION OF THE DRAWINGS

Other details and advantages of the invention will become apparent from the following detailed description of preferred embodiments in connection with the accompanying drawings in which like numerals designate like elements and in which.

DETAILED DESCRIPTION OF THE INVENTION

The present invention relates to a method of making nanoparticles of copper and/or zinc alloys (Cu—Zn) comprising subjecting a starting material to laser energy so as to form a vapor and condensing the vapor so as to form Cu, Zn, or Cu—Zn nanoparticles.

The starting material can be a Cu—Zn alloy target. Alternatively, the target can be a Cu—Zn alloy wrapped in zinc, or the target can be made by forming a compact from a mixture of copper and zinc powders, or a compact of brass and zinc powders. Separate copper and zinc targets can also be used.

According to the invention, the starting material is exposed to laser energy to bring about vaporization of the starting material. The amount of energy required to vaporize the target material can vary depending on variables such as the thermal and optical properties of the target material as well as the type of starting material and the conditions in the chamber.

The laser beam preferably vaporizes the target material directly, without the material undergoing a liquid phase transformation. The types of lasers that can be employed to generate the laser energy used in the practice of this invention include several commercially available lasers. In a preferred embodiment, laser energy can be provided by the output of the second harmonic of a pulsed yttrium aluminum garnet—neodymium (YAG-Nd) laser at a wavelength of 532 nm. The laser can be run at 20 Hz and can deliver a power of 20-40 mJ/pulse on the sample at a pulse duration of 10 nanoseconds.

In producing nanoparticles, the vapor produced according to the invention can be cooled or condensed by subjecting the vapor to collisions with an inert gas.

A preferred embodiment of a method according to the invention employs pulsed laser vaporization of at least one metal target into a selected gas mixture in a diffusion cloud chamber. Details of suitable diffusion cloud chambers can be found in J. L. Katz, *The Journal of Chemical Physics*, vol. 52, pp. 4733-4748 (1970), the disclosure of which is hereby incorporated by reference. The laser vaporization produces a high-density vapor within a very short time, typically $10^{-8}$ sec, in a directional jet that allows directed deposition.

Figure 1:
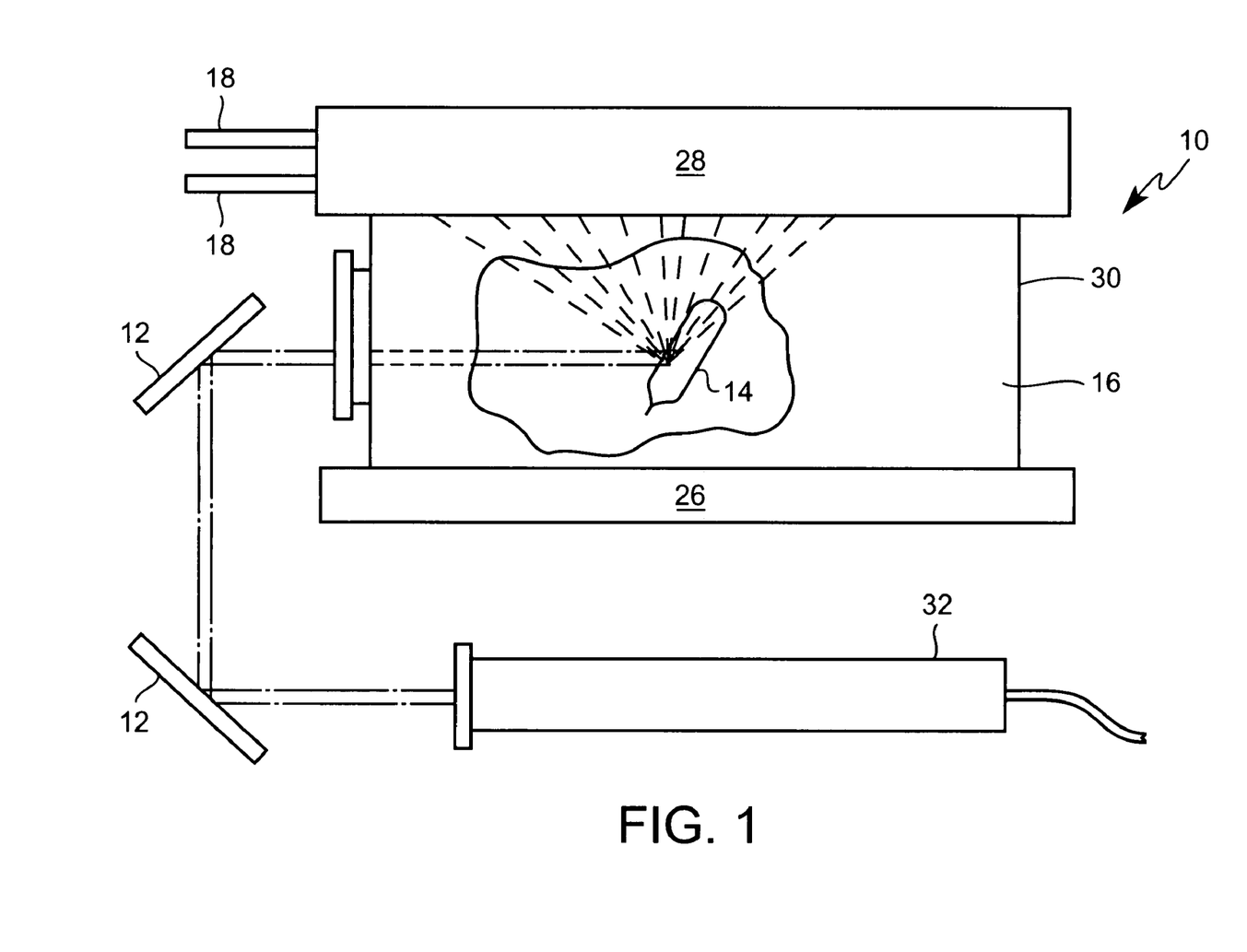
FIG. 1 shows an apparatus for conducting a laser vaporization and controlled condensation (LVCC) technique including a chamber and a single target in accordance with a first embodiment of the invention.

A cross-sectional view of an exemplary chamber is shown in FIG. 1. As shown, the chamber 10 consists of two horizontal circular stainless steel plates 26 and 28 separated by a circular glass tube 30 forming a diffusion cloud chamber 16. During laser vaporization, bottom plate 26 is typically maintained at a higher temperature than top plate 28. In this manner, a convection flow can be created inside the diffusion cloud chamber 16. Target 14 is mounted between plates 26 and 28, preferably closer to lower plate 26. Diffusion cloud chamber 16 can then be filled with a pure inert carrier gas such as helium or argon. Alternatively, diffusion could chamber 16 can be supplied with a reactive gas mixture such as a mixture of oxygen and helium. The use of oxygen allows for the formation of oxides in the nanoparticles. The pressure in the diffusion cloud chamber 16 is typically maintained at a total pressure of about 800-1000 torr during vaporization, though experiments can be carried out at pressures ranging from $10^{-3}$ torr to 1500 torr.

Glass tube 30 is located substantially as an outer glass wall to the diffusion cloud chamber 16 and is preferably heated during laser vaporization. For example, nichrome heater wires (not shown) can be wrapped around diffusion cloud chamber 16 to provide sufficient heat to prevent condensation on glass tube 30 and to maintain a constant temperature gradient between the lower plate and the cold plate. During operation, the nanoparticles will typically condense on upper plate 28.

Target 14 can comprise one or more target materials made from alloyed or pure copper and zinc, e.g., the target can be a copper-zinc alloy such as brass or a brass target wrapped or otherwise covered with zinc. Target 14, however, can also comprise a compacted mixture of copper and zinc powders.

The target 14 and lower plate 26 are preferably maintained at a temperature higher than the temperature of upper plate 28. For example, upper plate 28 can be cooled to less than 120 K by circulating a coolant such as liquid nitrogen through coolant lines 18. Coolant lines 18 supply coolant to internal passages (not shown) in the interior of upper plate 28. In this manner, upper plate 28 can be maintained at a desired temperature. A temperature gradient thus created between lower plate 26 and upper plate 28 provides a convection current. The convection current can be enhanced by adding helium, argon, or other inert gases, to the vacuum chamber under relatively high pressure, e.g., 800-1000 torr.

A vapor of the target material can be generated by the output from laser 32. In a preferred embodiment the output from the laser is the second harmonic ($\lambda=532$ nm) of a yttrium aluminum garnet-neodymium (YAG-Nd) laser. The laser is preferably pulsed. An exemplary pulse duration is about 10 nanoseconds. In a preferred embodiment, the laser is run at 20 Hz and delivers a power of 20-40 mJ/pulse on to the target.

As shown in FIG. 1, two mirrors 12 are used to direct the beam via reflection from the laser to the target. Other arrangements of one or more mirrors, however, can also be used. Further, the output from the laser can directly impinge on the sample without being reflected from a mirror.

Figure 2:
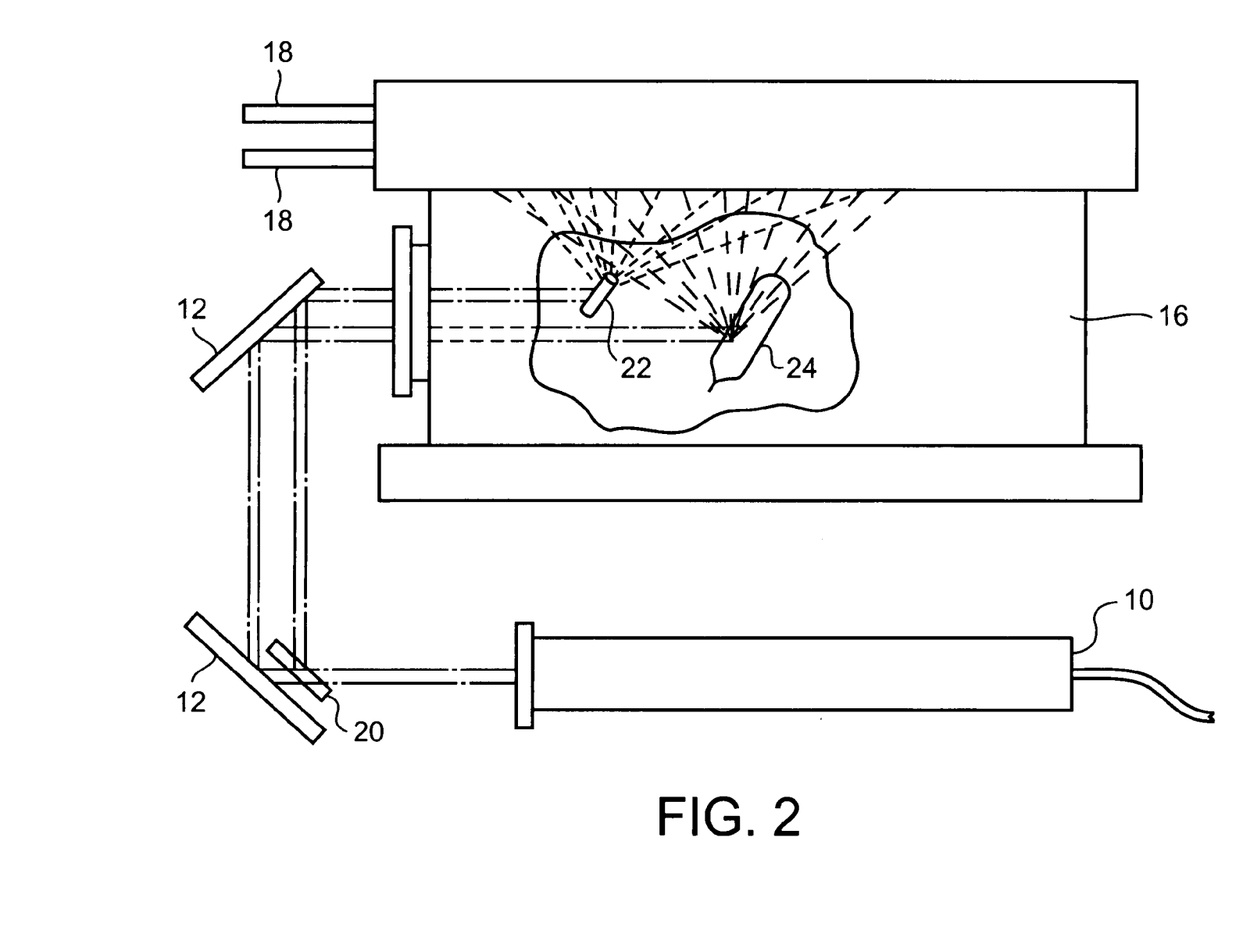
FIG. 2 shows an apparatus for conducting a laser vaporization and controlled condensation (LVCC) technique which includes a chamber and two targets in accordance with a second embodiment of the invention.

FIG. 2 illustrates an alternative embodiment of the apparatus according to the invention wherein an additional mirror is used to split the beam from laser 32 to two separate targets 22,24. As shown, beam splitting can be accomplished with semi-transparent mirror 20 which reflects a portion of the beam to second target 22 while permitting the other portion of the beam to pass through to first target 24. In a preferred embodiment of the invention, a copper target and a zinc target are used.

During laser vaporization, each pulse can release more than $10^{14}$ atoms of material from the target. The atoms ejected from the target or targets during vaporization can interact in a reaction zone of the chamber to form clusters in the vapor phase. These clusters of metallic or intermetallic material can then condense to form nanoparticles. The convection current created in the diffusion cloud chamber 16 helps to transport the condensed particles out of the reaction zone thereby limiting their growth. By controlling the laser power, and controlling the temperature gradient and the pressure in the chamber, the size of the nanoparticles can be controlled.

The laser vaporization and condensation procedure is preferably conducted for a period of several hours. In a preferred embodiment, the procedure is carried out for a period of about 2 hours. After the particles have been formed, the diffusion cloud chamber 16 can be brought to room temperature (20-25° C.), and the particles formed therein can be collected and stored under atmospheric conditions. In the arrangement described, the particles formed in diffusion cloud chamber 16 accumulate on upper plate 28.

Alternatively, condensation can occur out of the reaction zone and removed from the diffusion cloud chamber 16 such as in a collection chamber that may be periodically isolated, replaced, or removed from the diffusion cloud chamber 16 and/or the chamber 10 and the condensed particles collected while still allowing continuous production of condensed particles of the vaporized target alloy materials.

The laser vaporization and condensation technique according to the invention has numerous advantages. For example, laser vaporization does not require containers for the evaporated substances and the material of interest can be directly ablated from the surface of the target material. In contrast, conventional gas condensation techniques employ an oven to produce vapors of the metal contained in a crucible and the vaporization temperature is limited by the vaporization temperature of the crucible material. Additionally, laser vaporization and condensation allows for the controlled production of materials which include oxides, nitrides and carbides of the target materials.

The as deposited Cu and/or Zn alloy nanoparticles are black in color. Scanning electron micrographs (SEM) show that the condensed nanoparticles are aggregated into web-like structures.

The nanoparticle synthesis reaction is preferably performed with an inert environment of helium or argon at pressures higher than atmospheric pressure in the diffusion cloud chamber 16, which eliminates the possibility of atmospheric contamination during the nanoparticle synthesis. However, the reaction may also be carried out at pressures lower than atmospheric pressure. For example, the reaction may occur at pressures as low as $10^{-3}$ torr.

During a production run, the laser beam can be moved to expose new surfaces of the target. This ensures improved reproducibility of the desired vapor following each laser pulse.

An added advantage of the synthesis reaction is the capability of preparing selected oxide nanoparticles of the target materials, including intermetallic nanoparticles, by precisely introducing known concentrations of oxygen into the vacuum chamber.

The synthesis reaction may also be used to produce carbide nanoparticles of the target materials, including intermetallic nanoparticles. When these carbides are desired, the reactive mixture contains an inert carrier gas and a carbon-containing gas such as a hydrocarbon, e.g. isobutene.

The synthesis reaction preferably uses pulsed laser vaporization with control of the condensation process from the vapor phase under defined conditions of temperature and pressure in a chamber. The collisions between the primary particles undergoing Brownian motion during the gas-to-particle conversion can result in the formation of nanoparticle aggregates. The structure of the aggregates included substantially open web-like structures to compact assemblies of primary nanoparticles. Since the laser vaporization and condensation process produces a mixture of mostly atoms and a small fraction of ions, it is expected that both neutral and charged (by ions or free electrons) nanoparticles are formed during the processes.

Figure 3:
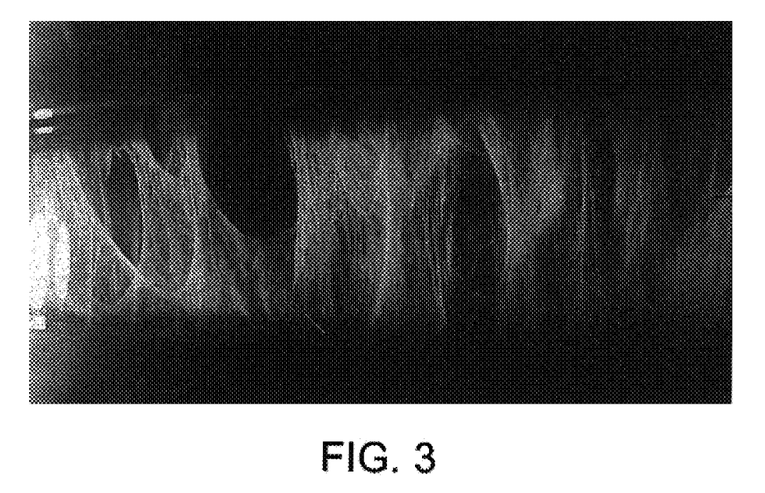
FIG. 3 shows fibers of nanoparticles formed under the influence of an electric field.

It is possible to influence the growth mechanism and the structures of the aggregates by applying an electric field during the formation of the nanoparticles. For instance, laser vaporization can be conducted in the presence of an electric field so as to form nanowires, nanotubes, nano-filaments, or filament-like or tree-like aggregates of the Cu—Zn alloy nanoparticles. In one aspect, the nanoparticles formed in the presence of an electric field have an aspect ration >1. The chains and the tree-like aggregates display stretch and contraction properties depending on the strength of the applied field. For example, the electric field may be applied at 30 to 300 V/cm and can be, for example, an integral feature of the chamber. FIG. 3 shows fibers formed under the influence of an electric field. In the image in FIG. 3, −300 V was applied to the top plate.

Laser vaporization controlled condensation can form Cu and/or Zn nanoparticles with various compositions. Hence the composition of the final products (nanoparticles) will be dependent on the ratio of Cu to Zn atoms available in the reaction/nucleation zone. This experimental technique allows the flexibility of vaporizing single or multiple targets. Depending on the composition of the single or multiple targets, the amount of Cu and Zn atoms in the vapor can be manipulated to any desired ratio to form Cu and/or Zn nanoparticles.

For example, if a target on vaporization gives only (Cu,Zn) or α-brass but it is desired to prepare nanoparticles of the intermetallic γ-$Cu_5Zn_8$ or γ-brass, then an additional target, such as pure Zn, can be placed with the original (Cu,Zn) or λ-brass target and simultaneously vaporized to enhance the amount of Zn in the vapor and thus favor the formation of Zn rich phase γ-$Cu_5Zn_8$.

In one exemplary method, pellets containing different compositions of micron sized Cu and Zn powders [−100+325 mesh size (44 μm<particle size<149 μm)] were prepared and then vaporized. On vaporizing the pellets, a certain ratio of Cu to Zn atoms will be formed in the vapor. The atoms so formed will then interact or react with each other to recondense and form the corresponding nanoparticles.

Figure 4:
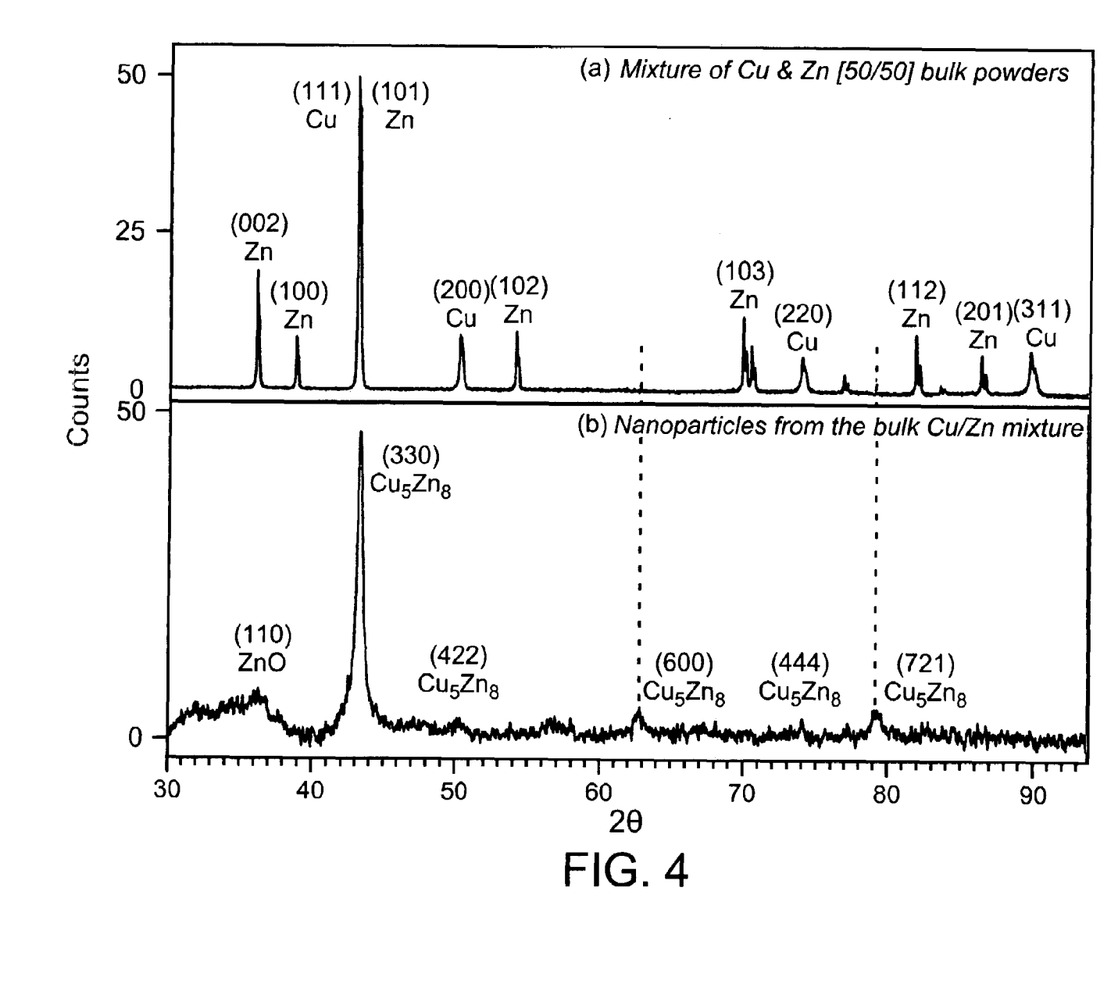
FIG. 4(a) is a comparison of x-ray diffraction patterns for a mixture of Cu and Zn (50:50 by weight) bulk powders
FIG. 4(b) is a comparison of x-ray diffraction patterns for corresponding nanoparticles formed following vaporization of the mixture in FIG. 4(a).

FIG. 4 is a comparison of the x-ray diffraction (XRD) patterns for a bulk powder mixture and an intermetallic nanoparticle. FIG. 4(a) shows the XRD pattern of the pellet formed by pressing 50/50 wt. % of the Cu and Zn powders. As seen in the XRD, all the peaks belong to either Cu or Zn and there is no evidence of any alloy formation in this case. FIG. 4(b) presents the XRD pattern of nanoparticles formed by the vaporization of the pellet whose XRD is shown in FIG. 4(a). As compared to FIG. 4(a), the nanoparticles formed are not just a mixture of separate Cu and Zn powders but intermetallic Cu—Zn nanoparticles. The XRD peaks can be assigned to diffraction from the (330), (422), (600), and (721) planes, respectively, of the γ-$Cu_5Zn_8$ or γ-brass crystal lattice.

Figure 5:
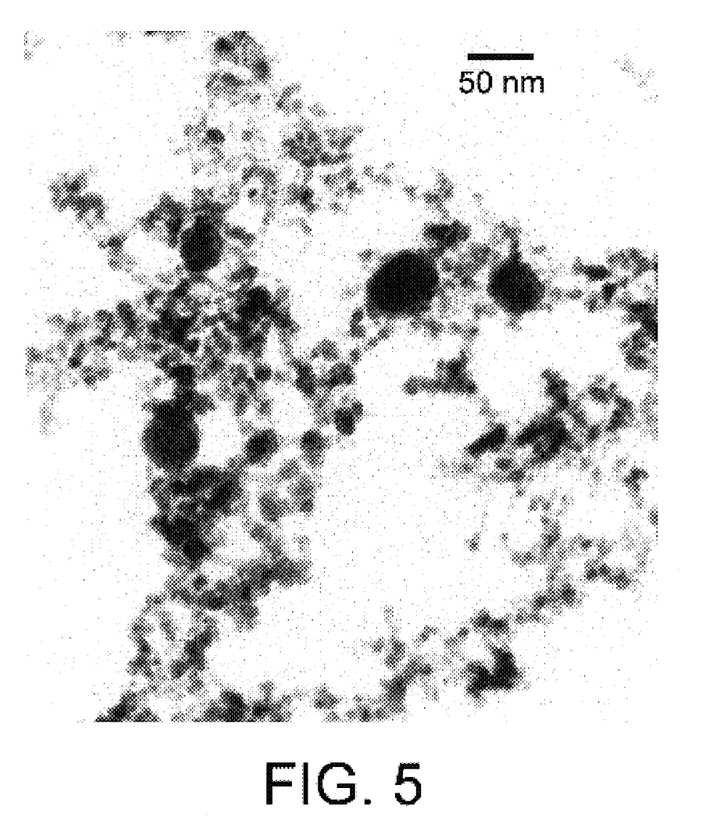
FIG. 5 is a TEM image of the nanoparticles corresponding to the x-ray diffraction patterns in FIG. 4(b).

FIG. 5 is a TEM image of the nanoparticles corresponding to the XRD in FIG. 4(b). The TEM image shows that the average particle size is about 20 nm.

Figure 6:
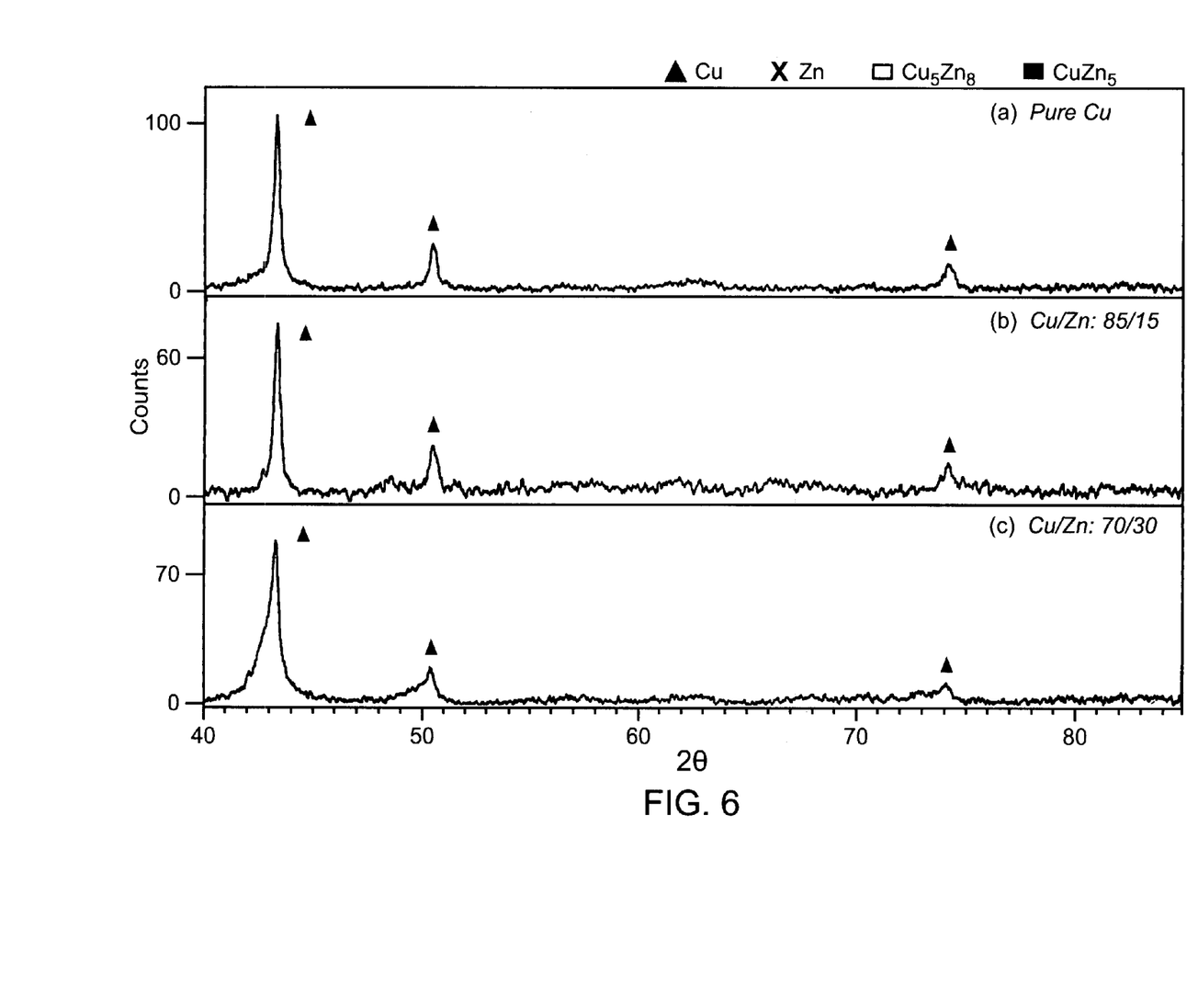
FIG. 6(a) shows X-ray diffraction patterns for nanoparticles prepared from pure copper.
FIG. 6(b) shows X-ray diffraction patterns for nanoparticles of a Cu/Zn alloy comprising 85 wt. % copper and 15 wt. % zinc.
FIG. 6(c) shows X-ray diffraction patterns for nanoparticles of a Cu/Zn alloy comprising 70 wt. % copper and 30 wt. % zinc.
FIG. 6(d) shows X-ray diffraction patterns for nanoparticles of a Cu/Zn alloy comprising 40 wt. % copper and 60 wt. % zinc.
FIG. 6(e) shows X-ray diffraction patterns for nanoparticles of a Cu/Zn alloy comprising 15 wt. % copper and 85 wt. % zinc.
FIG. 6(f) shows X-ray diffraction patterns for nanoparticles of pure Zn.

Cu, Zn, and Cu/Zn alloy nanoparticles have been prepared using the laser vaporization controlled condensation technique according to the invention. The XRD patterns of nanoparticles prepared by vaporization of pellets made by pressing several different compositions (wt. %) of Cu and Zn powders ($Cu_xZn_{100-x}$) are presented in FIGS. 6(a)-(f). FIG. 6 shows x-ray diffraction data for: (a) nanoparticles prepared from pure copper; (b) nanoparticles of a Cu/Zn alloy comprising 85 wt. % copper and 15 wt. % zinc; (c) nanoparticles of a Cu/Zn alloy comprising 70 wt. % copper and 30 wt. % zinc; (d) nanoparticles of a Cu/Zn alloy comprising 40 wt. % copper and 60 wt. % zinc; (e) nanoparticles of a Cu/Zn alloy comprising 15 wt. % copper and 85 wt. % zinc; and (f) nanoparticles of pure Zn. XRD patterns were obtained using a Philips X'Pert Materials Research Diffractometer with Cu $K_{\alpha 1}$ radiation. The size and shape of the individual particles were investigated using a Jeol JEM-200FXE transmission electron microscope (TEM) operated at 200 kV, which was also equipped with a Tracor Northern 5500 EDX analysis system for compositional analysis. High resolution TEM images were obtained using the Jeol-4000EX operated at 400 kV.

As can be seen from FIG. 6(a), the XRD pattern of the pure copper nanoparticles exhibits prominent peaks at diffraction angles (2θ) of 43.31°, 50.46°, and 74.09°, which are assigned to diffraction from the (111), (200), and (220) planes, respectively, of the copper crystal lattice.

As can be seen from FIG. 6(f), the XRD pattern of nanoparticles of pure Zn (graph f) exhibits prominent peaks at diffraction angles (2θ) of 43.24°, 54.32°, 70.08°, and 82.09°, which are assigned to diffraction from the (101), (102), (103), and (112) planes, respectively, of the zinc crystal lattice.

As can be seen from FIG. 6(b), the XRD pattern of nanoparticles of a Cu/Zn alloy comprising 85 wt. % copper and 15 wt. % zinc exhibits prominent peaks at diffraction angles (2θ) of 43.34°, 50.52°, and 74.17°, which are assigned to planes in the Cu crystal lattice.

As can be seen from FIG. 6(c), the XRD pattern of nanoparticles of a Cu/Zn alloy comprising 70 wt. % copper and 30 wt. % zinc exhibits prominent peaks at diffraction angles (2θ) of 43.29°, 50.37°, and 74.11°, which are assigned to planes in the Cu crystal lattice. In FIG. 6(c), the shoulder to the left of each of the three peaks is indicative of the formation of a solid solution of Cu and Zn, or brass.

As can be seen from FIG. 6(d), the XRD pattern of nanoparticles of a Cu/Zn alloy comprising 40 wt. % copper and 60 wt. % zinc exhibits prominent peaks at diffraction angles (2θ) of 43.25°, 56.59°, 62.810, and 79.29°. The 2θ peaks of 43.25°, 62.81°, and 79.29° are assigned to diffraction from the (330), (600), and (721) planes in the $Cu_5Zn_8$ crystal lattice.

As can be seen from FIG. 6(e), the XRD pattern of nanoparticles of a Cu/Zn alloy comprising 15 wt. % copper and 85 wt. % zinc exhibits prominent peaks at diffraction angles (2θ) of 42.07°, 43.29°, 57.67°, 62.83°, 68.09°, 77.79°, and 83.27°. The 2θ peaks of 43.29°, 62.83°, and 78.50° are assigned to diffraction from planes in the $Cu_5Zn_8$ crystal lattice. The 2θ peaks of 42.07°, 57.67°, 68.09°, 77.79°, and 83.27° are assigned to diffraction from planes in the $CuZn_5$ crystal lattice.

Figure 7:
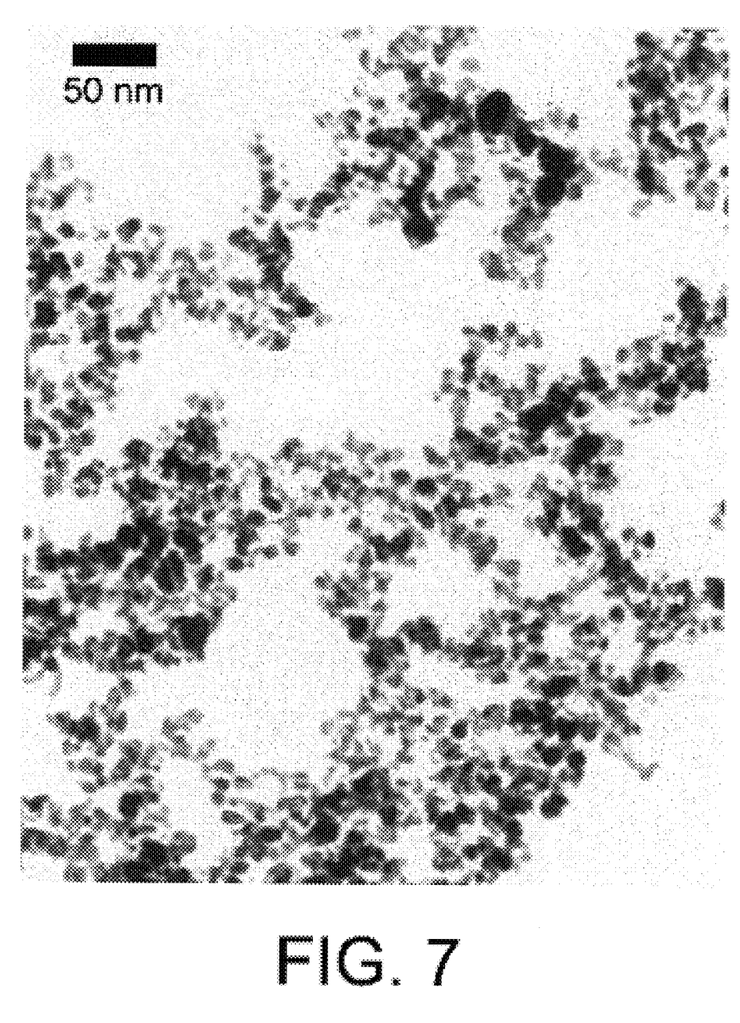
FIG. 7 is a TEM image of particles made by vaporizing pellets formed by pressing 15/85 wt. % Cu/Zn powder.

The Cu and/or Zn alloy nanoparticles according to the invention can have an average particle size below 20 nm as measured using TEM. A TEM image of particles made by vaporizing the pellet made by pressing 15/85 wt. % of the Cu and Zn powders is seen in FIG. 7. The average size of the nanosize particles are about 20 nm.

As set forth above, in a preferred embodiment, a steady convection current is created within the diffusion cloud chamber. The steady convection current can be achieved by maintaining the top plate at a temperature significantly lower than the bottom plate. As a result, the top plate is called the condensation or deposition plate. The convection current can be created, for example, by cooling the top plate and keeping the bottom plate at room temperature or by heating the bottom plate and keeping the top plate at room temperature. Nichrome heating wires can be wrapped around the glass tube to heat the glass tube in order to minimize deposition on the glass and also to ensure a more uniform temperature gradient between the two plates. The temperatures of the plates can be monitored using thermocouples attached to each plate. The thermocouples can be connected to a temperature readout.

During vaporization, the atoms ejected from the surface of the bulk target or targets preferably interact with the atmosphere in the diffusion cloud chamber. Due to the convection current, the temperature of the atmosphere decreases as the top plate is approached resulting in maximum supersaturation developing in the upper half of the diffusion cloud chamber. The higher the degree of supersaturation, the smaller the size of the nucleus required for condensation. The degree of supersaturation of the vapor can be enhanced by varying the temperature gradient. Convection also plays a role in moving the particles out of the nucleation zone before they grow too large in size. Convection within the diffusion cloud chamber can be enhanced by increasing the temperature gradient or by using a heavier carrier gas (argon as compared to helium). Thus, by controlling the laser power, the temperature gradient and the chamber pressure and/or atmosphere, the size and/or shape of the condensing particles can be controlled.

Process variables which can result in different phases being formed include the type and pressure of the inert gas used in the diffusion cloud chamber, the temperatures of the top and bottom plates, and the laser power. Additionally, when the laser is split, the relative intensity of each of the split laser beams can influence the phases formed during laser vaporization and condensation.

The Cu—Zn alloy nanopowders can be used in a variety of applications. For example, the powders can be dispersed in a suitable carrier and used as inks for ink-jet printing applications. The Cu—Zn nano-powders can also be used for generating metallic images or metallic conductive patterns on substrates. The nano-powders of the invention can also be used in powder metallurgy applications for the preparation of metallurgical components, for the fabrication of metallic films or to prepare layered structures such as functionally gradient materials. The nanoparticles can be used as catalysts in chemical reactions, for example, in the conversion of CO to $CO_2$.

In an additional aspect, micron sized brass powder and Zn powders can be the initial starting material instead of elemental Cu and Zn powders.

Figure 8:
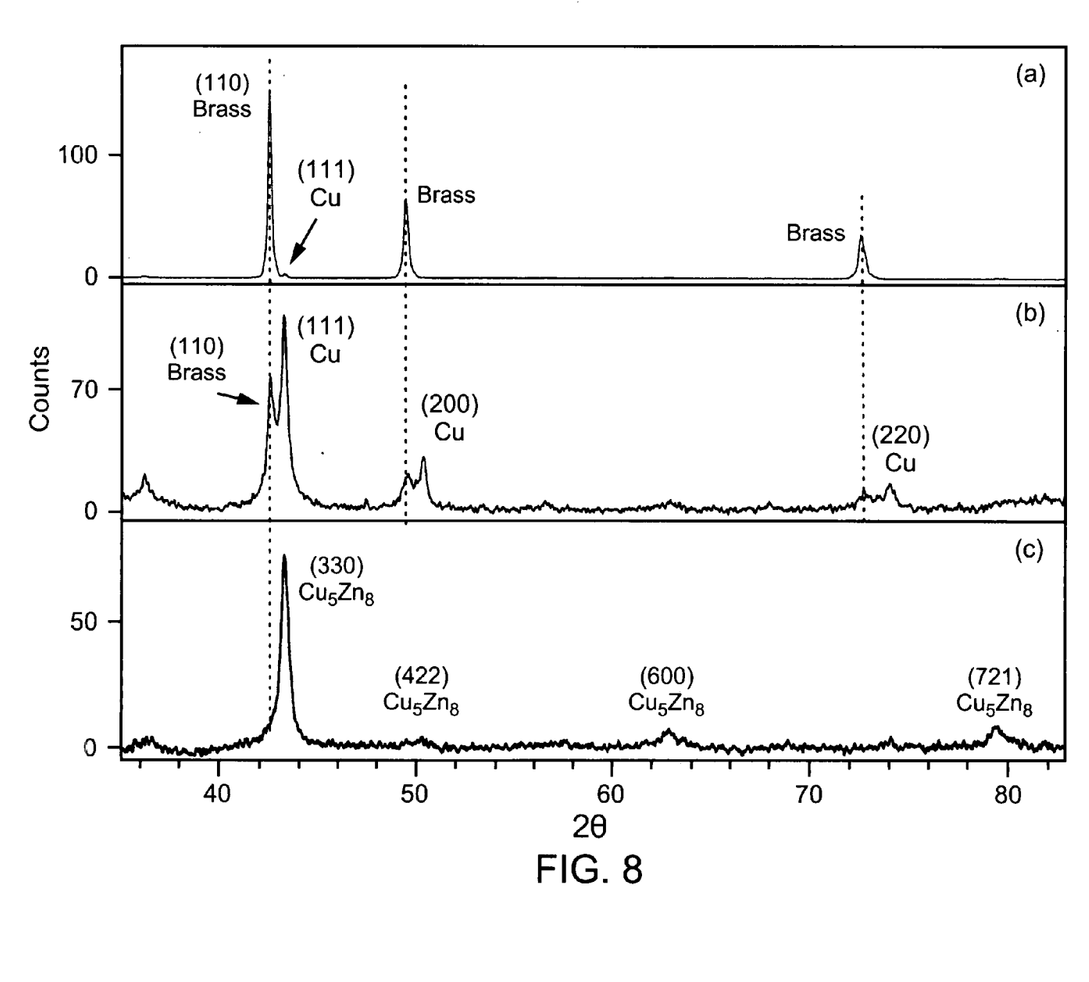
FIG. 8(a) shows x-ray diffraction patterns for a commercially available micron size brass powder having a Cu/Zn composition of 70 wt. % Cu and 30 wt. % Zn.
FIG. 8(b) shows x-ray diffraction patterns for black nanoparticles formed following laser vaporization of the powder in FIG. 8(a)
FIG. 8(c) shows x-ray diffraction patterns for a mixture of brass powder and pure elemental Zn powder pressed into a pellet and having an overall atomic composition of 25 wt. % Cu and 75 wt. % Zn.

FIG. 8(a) shows the XRD pattern of commercially available micron sized brass (Cu/Zn) powder (Cu/Zn: 70/30 wt. %). Peaks are observed at diffraction angle (2θ) values of 42.52°, 49.52° and 74.64°. The three main peaks compare well with peaks listed in the database XRD card for α-brass (Cu,Zn). The peak at 42.52° has been indexed to diffraction from the (110) plane of α-brass. An additional peak at 88.02° (not shown) has been indexed to the (009) plane of α-brass. FIG. 8(b) displays the XRD pattern of the black nanoparticles produced following laser vaporization of the micron sized brass particles. On comparing the two patterns it is apparent that the nanoparticle sample contains α-brass. In addition, there also exists another set of peaks at 2θ values of 43.26°, 50.4°, 74.06° and 89.90° (not shown) which can be indexed to diffraction from the (111), (200), (220) and (311) planes of copper. The above observations indicate that laser vaporization of the micron sized brass powder results mainly in a mixture of Cu and α-brass nanoparticles.

In order to form Zn rich intermetallic phases, the Zn vapor within the reaction chamber can be enriched as compared to the vapor obtained by vaporizing the bulk brass powder with Cu/Zn:70/30 wt. % ratio. To facilitate this, a mixture of brass powder and pure elemental Zn powder was pressed into a pellet such that the overall atomic composition of the pellet was Cu/Zn: 25/75 wt. %. FIG. 8(c) illustrates the XRD pattern of nanoparticles formed following laser vaporization of the pellet. Changes in the XRD pattern as compared to FIGS. 8(a) and 8(b) show that neither the Cu nor the α-brass phases are formed. The peaks observed at 2θ values of 43.28°, 50.37°, 62.85° and 79.38° can be assigned to diffraction from the (330), (422), (600) and (721) planes of the intermetallic γ-brass phase, which has the composition $Cu_5Zn_8$.

In still a further aspect, a solid brass and Zn target can be used as the starting material and the main source of manipulation of the ratio of Cu to Zn atoms in the vapor is through the laser source.

Figure 9:
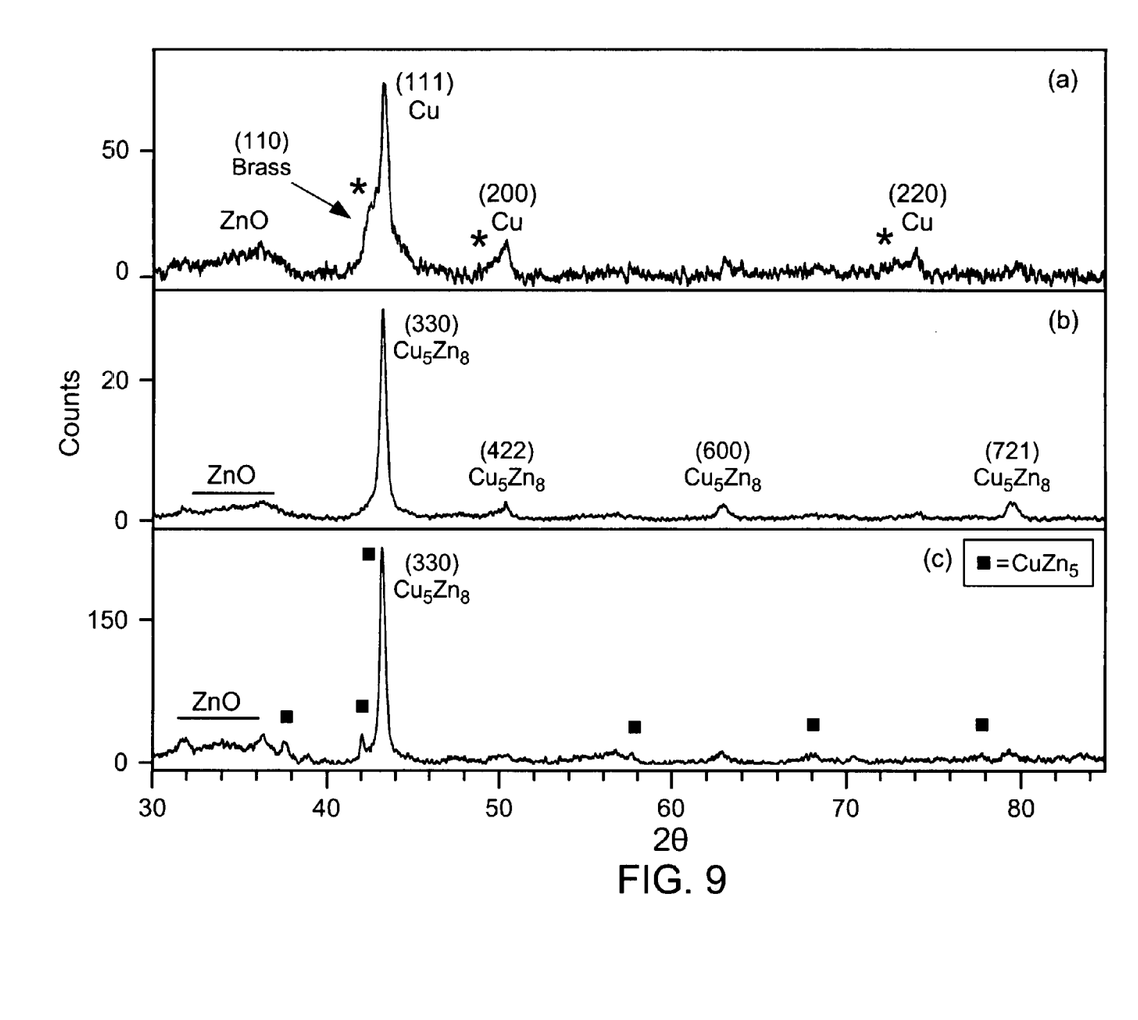
FIG. 9(a) shows x-ray diffraction patterns for black nanoparticles obtained following laser vaporization of a Cu/Zn alloy having 63 wt. % Cu and 37 wt. % Zn.
FIG. 9(b) shows x-ray diffraction patterns for nanoparticles formed from the 50:50 splitting of the spot size during laser vaporization at two targets—a Cu/Zn 63/37 wt. % brass sample and a 99+% Zn target.
FIG. 9(c) shows x-ray diffraction patterns for nanoparticles formed from the ⅓:⅔ splitting of the spot size during laser vaporization of two targets—a Cu/Zn 63/37 wt. % brass sample and a 99+% Zn target.

FIG. 9(a) shows the XRD pattern of the black nanoparticles obtained following the laser Vaporization of a commercially available brass (Cu/Zn: 63/37 wt. %) target. Prominent peaks are observed at angles (2θ) of 43.33°, 50.47° and 74.11°. These can be indexed to diffraction from the (111), (200) and (220) planes of Cu. In addition, each of these peaks contains a shoulder due to the presence of an adjacent peak (denoted by *). These adjacent peaks overlap each other and could not be resolved into separate peaks as XRD peaks, the broadening being due to the nanocrystalline size of the particles. These shoulders were found to be absent in the XRD pattern of Cu nanoparticles prepared by vaporization of a pure Cu (99.999%) target as can be seen in FIG. 6(a). The shoulder peaks could be attributed to the presence of brass (Cu,Zn) or α-brass nanoparticles within the sample.

The laser vaporization condensation technique allows the vaporization technique allows the vaporization of two targets simultaneously. The Cu/Zn sample (Cu/Zn: 63/37 wt. %), was entrapped in a hole drilled within a 99+% Zn target. The vaporization laser spot was then split between the two targets such that it was approximately 50% on the brass target and 50% on the Zn target. Following laser vaporization, Cu and Zn atoms can be produced from the brass sample and in addition Zn atoms can also be produced from the Zn target, thus creating an excess of Zn atoms in the vapor. An XRD pattern of the nanoparticles formed is shown in FIG. 9(b). As denoted in the figure, all the peaks observed can be indexed to diffraction from the intermetallic $\gamma\text{-}Cu_5Zn_8$ phase. FIG. 9(c) presents the XRD spectra of the nanoparticles formed after moving the laser spot such that it was approximately one-third on the brass target and two-thirds on the Zn target. This further enhanced the concentration of Zn atoms in the vapor and as expected peaks corresponding to the more Zn rich intermetallic phase b were observed (denoted by ■). $CuZn_5$ was the preferential phase formed. In both samples, the presence of trace quantities of ZnO was noted.

Nanoparticles formed by the method of the present invention can be used in industrial and environmental processes. For example, nanoparticles of Cu and/or Zn and/or $CuZnO_2$ can be used as a catalyst for hydrocarbons. The nanoparticles can also be used as a CO catalyst or can be used as a catalyst in the oxidation of methanol. The Cu and/or Zn and/or $Cu/ZnO_2$ nanoparticles can be used alone or in conjunction with other suitable hydrocarbon catalysts. For example, a supported catalytic structure (i.e., a catalytic structure with a catalyst material deposited thereon) can have the catalyst in the form of nanoparticles of Cu and/or Zn. The Cu and/or Zn nanoparticles can be formed by laser vaporization with controlled condensation (LVCC) and deposited on the catalytic structure by suitable means. In one aspect, the nanoparticles of Cu and/or Zn can be dispersed in a suitable carrier and printed, either uniformly or in a pattern, by an inkjet technique on a substrate. In another aspect, the nanoparticles of Cu and/or Zn can be used in powder metallurgical applications for the preparation of metallurgical components, for the fabrication of metallic films, or to prepare layered structures such as functionally gradient materials.

While the present invention has been described by reference to the above-mentioned embodiments, certain modifications and variations will be evident to those of ordinary skill in the art. Therefore, the present invention is to limited only by the scope and spirit of the appended claims.

What is claimed is:

1. A method of making nanoparticles of a copper/zinc (Cu/Zn) alloy comprising:
   mounting one or more targets in a chamber;
   vaporizing material from each of the one or more targets by subjecting each of the one or more targets to a beam of laser energy to form a vapor, wherein the vapor is formed in a temperature gradient from a first temperature to a second temperature, the first temperature higher than the second temperature; and
   cooling the vapor between the first temperature and second temperature to condense the vapor to form the Cu/Zn alloy nanoparticles.

2. The method according to claim 1, wherein the one or more targets comprises a single target comprising a Cu/Zn alloy.

3. The method according to claim 2, wherein the single target comprises a Cu/Zn alloy wrapped in zinc.

4. The method according to claim 2, wherein the single target is a compact comprising copper and zinc powders or a compact comprising brass and zinc powders.

5. The method according to claim 1, wherein the Cu/Zn alloy nanoparticles have an average particle size of less than about 20 nm.

6. The method according to claim 1, wherein the laser is a YAG-Nd laser and wherein the emission from the laser comprises the second harmonic at a wavelength of 532 nm.

7. The method according to claim 1, wherein the laser energy is pulsed.

8. The method according to claim 7, wherein the pulses of laser energy have a duration of about 10 nanoseconds.

9. The method according to claim 7, wherein each pulse of laser energy delivers from 20-40 mJ of energy to the target.

10. The method according to claim 1, wherein the nanoparticles are formed in the presence of an electric field and wherein the nanoparticles comprise filaments, nanowires or nanotubes.

11. The method according to claim 10, wherein the nanoparticles have an aspect ratio greater than 1.

12. The method according to claim 10, wherein the electric field is applied at 30 to 300 V/cm.

13. The method according to claim 1, wherein the vaporization and condensing are carried out in a diffusion cloud chamber.

14. The method according to claim 13, wherein the diffusion cloud chamber comprises an upper portion and a lower portion and wherein the upper portion is maintained at the second temperature and the lower portion is maintained at the first temperature such that the vapor cools to condense into nanoparticles in the upper portion.

15. The method according to claim 1, wherein an inert carrier gas or a reactive mixture comprising an inert carrier gas and a reactive gas is added to the chamber.

16. The method according to claim 15, wherein the inert carrier gas is helium or argon.

17. The method according to claim 15, wherein the reactive mixture comprises an inert gas and isobutene.

18. The method according to claim 15, wherein the reactive mixture comprises oxygen and an inert gas and wherein the nanoparticles comprise one or more oxides of copper and/or zinc.

19. The method according to claim 18, wherein the nanoparticles comprising one or more oxides of copper and/or zinc are CuO, ZnO, or $Cu_2O$.

20. The method according to claim 1, wherein the nanoparticles comprise intermetallic compounds of copper and zinc.

21. The method according to claim 20, wherein the intermetallic compounds comprise $Cu_5Zn_8$ and/or $CuZn_5$.

22. The method according to claim 1, wherein the one or more targets comprises a first target comprising copper and a second target comprising zinc, the method further comprising steps of:
splitting the beam of laser energy into a first beam and a second beam of laser energy;
subjecting the first target to the first beam of laser energy to form a first vapor;
subjecting the second target to the second beam of laser energy to form a second vapor;
mixing the first and second vapors; and
condensing the mixed vapors to form the Cu/Zn alloy nanoparticles.

23. The method according to claim 1, wherein the beam of laser energy is moved relative to the one or more targets.

24. The method according to claim 1, wherein pressure in the chamber is maintained in the range of $10^{-3}$ to $10^{-4}$ torr during the vaporization step.

25. The method according to claim 1, further comprising maintaining a convection current flow in the chamber during the vaporization step.

26. The method according to claim 1, wherein pressure in the chamber during vaporization is maintained above atmospheric pressure.

27. A method of making nanoparticles of copper (Cu) comprising:
mounting one or more targets in a chamber having an upper and lower portion, at least one of the targets comprising a first target comprising copper;
vaporizing material from at least one of the one or more targets by subjecting the at least one target to a beam of laser energy to form a first vapor;
establishing and maintaining a temperature gradient in the chamber between upper and lower portions thereof by maintaining the upper portion at a lower temperature than the lower portion;
cooling the first vapor in the upper portion to condense the first vapor to form the Cu nanoparticles; and
collecting and removing the Cu nanoparticles from the chamber.

28. The method according to claim 27, further comprising steps of:
optionally mixing the first vapor and a second vapor,
wherein the second vapor is an inert carrier gas or a reactive mixture comprising an inert carrier gas and a reactive gas and the Cu nanoparticles comprise one or more oxides of copper.

29. A method of making nanoparticles of zinc (Zn) comprising:
mounting one or more targets in a chamber having an upper and lower portion, at least one of the targets comprising a first target comprising zinc;
establishing and maintaining a temperature gradient in the chamber between upper and lower portions thereof by maintaining the upper portion at a lower temperature than the lower portion; and
vaporizing material from at least one of the one or more targets by subjecting the at least one target to a beam of laser energy to form a first vapor;
cooling the first vapor in the upper portion to condense the first vapor to form the Zn nanoparticles; and
collecting and removing the Zn nanoparticles from the chamber.

30. The method according to claim 29, further comprising steps of:
optionally mixing the first vapor and a second vapor,
wherein the second vapor is an inert carrier gas or a reactive mixture comprising an inert carrier gas and a reactive gas and the Zn nanoparticles comprise one or more oxides of zinc.

31. A powder consisting of nanosized particles of Cu/Zn alloy having an average particle size of $\leq 20$ nm, wherein the nanosized particles are condensed from a laser vaporized material.

32. The powder of claim 31, wherein the average particle size is less than about 20 nm.

33. The powder of claim 31, wherein the nanosized particles comprise one or more intermetallic compounds of copper and zinc.

34. The powder of claim 33, wherein the intermetallic compounds comprise $Cu_5Zn_8$ and/or $CuZn_5$.

35. A powder consisting of nanosized Cu—Zn alloy particles produced by condensation of material from a laser vaporization of first and second targets, wherein a first target comprises copper and a second target comprises zinc.

36. The powder of claim 35, wherein the nanosized particles comprise one or more intermetallic compounds of copper and zinc.

37. The powder of claim 36, wherein the intermetallic compounds comprise $Cu_5Zn_8$ and/or $CuZn_5$.

38. A supported catalytic structure comprising:

a catalytic structure; and a catalyst, wherein the catalyst comprises a plurality of nanoparticles of Zn or Cu/Zn formed by the process of laser vaporization with controlled condensation.

* * * * *